(12) United States Patent
Lim et al.

(10) Patent No.: US 8,138,429 B2
(45) Date of Patent: Mar. 20, 2012

(54) ELECTROMAGNETIC SHIELDING ARTICLE

(75) Inventors: Jeffrey A. Lim, Austin, TX (US); Sywong Ngin, Austin, TX (US); Robert L. Lambert, Jr., Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 477 days.

(21) Appl. No.: 12/337,299

(22) Filed: Dec. 17, 2008

(65) Prior Publication Data

US 2010/0224402 A1 Sep. 9, 2010

(51) Int. Cl.
*H05K 9/00* (2006.01)

(52) U.S. Cl. .............. 174/386; 174/394; 340/572.8

(58) Field of Classification Search ............ 174/386, 174/394; 340/572.7, 572.8; 361/816
See application file for complete search history.

(56) References Cited

U.S. PATENT DOCUMENTS

| | | | |
|---|---|---|---|
| 4,647,714 | A | 3/1987 | Goto |
| 4,774,148 | A | 9/1988 | Goto |
| 6,121,544 | A | 9/2000 | Petsinger |
| 6,683,583 | B2 | 1/2004 | Ngin |
| 6,855,404 | B2 | 2/2005 | Anderson et al. |
| 7,083,083 | B2 | 8/2006 | Droz |
| 7,335,275 | B2 | 2/2008 | Anderson et al. |
| 2002/0142684 | A1* | 10/2002 | Miska ............... 442/63 |
| 2005/0128085 | A1 | 6/2005 | Bon |
| 2008/0000987 | A1 | 1/2008 | Augustinowicz et al. |
| 2008/0001761 | A1* | 1/2008 | Schwarz ............ 340/572.8 |

FOREIGN PATENT DOCUMENTS

| | | |
|---|---|---|
| EP | 0 838 781 A2 | 4/1998 |
| EP | 1 245 720 A1 | 10/2002 |
| JP | 11020076 A | 1/1999 |
| JP | 2000062082 A | 2/2000 |
| JP | 2006152129 A | 6/2006 |
| WO | WO 2004/054940 A2 | 7/2004 |
| WO | WO 2006/107397 A2 | 10/2006 |
| WO | WO 2008/008203 A2 | 1/2008 |
| WO | WO 2008/091734 A1 | 7/2008 |

OTHER PUBLICATIONS

PCT International Search Report, PCT/US2009/064338.
Product Brochure: "3M™ ToughShield™ Protective Sleeves," 3M Electrical Markets Division, (2008), 2 pages.

* cited by examiner

*Primary Examiner* — Hung Ngo
(74) *Attorney, Agent, or Firm* — Johannes P. M. Kusters

(57) ABSTRACT

A shielding article includes a polymeric conductive layer and a protective layer disposed adjacent the polymeric conductive layer. The polymeric conductive layer provides electromagnetic shielding characteristics so as to prevent receipt of data from a radio frequency information component by an external device when the component is located between the external device on one side and the polymeric conductive and protective layers on the other side. The shielding article may be shaped to substantially surround the radio frequency information component.

18 Claims, 9 Drawing Sheets

ELECTROMAGNETIC SHIELDING ARTICLE

TECHNICAL FIELD

The present invention relates to radio frequency identification and, more particularly, to articles for protecting information in radio frequency identification systems.

BACKGROUND

Radio frequency identification devices (RFID) carry data or information that can be accessed by a corresponding receiver. RFID creates an automatic way to collect information about a product, place, time or transaction quickly, easily and without human error. It provides a contactless data link, without need for line of sight or concerns about harsh or dirty environments that restrict other auto ID technologies such as bar codes. In addition, RFID is more than just an ID code, it can be used as a data carrier, with information being written to and updated as necessary or appropriate. The data or information carried and stored within RFID may be susceptible to dissemination and capture by persons not otherwise authorized to receive the data or information. Such unauthorized capture or receipt of RFID data or information presents a problem for those wishing to carry and store data or information safely within RFID.

SUMMARY

In one aspect, the present invention provides a shielding article including a polymeric conductive layer and a protective layer disposed adjacent the polymeric conductive layer. The polymeric conductive layer provides electromagnetic shielding characteristics so as to prevent receipt of data from a radio frequency information component by an external device when the component is located between the external device on one side and the polymeric conductive and protective layers on the other side.

In another aspect, the present invention provides shielding article including a polymeric conductive layer and a protective layer disposed adjacent the polymeric conductive layer. The shielding article is shaped to substantially surround a radio frequency information component. The polymeric conductive layer provides electromagnetic shielding characteristics so as to prevent receipt of data from the radio frequency information component by an external device when the radio frequency information component and the shielding article are in an assembled configuration.

In another aspect, the present invention provides a method including providing a shielding article including a polymeric conductive layer and a protective layer disposed adjacent the polymeric conductive layer, disposing a radio frequency information component adjacent the polymeric conductive layer of the shielding article, shielding electromagnetic communication between the radio frequency information component and an external device, and preventing unauthorized release of information from the radio frequency information component.

The above summary of the present invention is not intended to describe each disclosed embodiment or every implementation of the present invention. The Figures and detailed description that follow below more particularly exemplify illustrative embodiments.

DETAILED DESCRIPTION

In the following detailed description of the preferred embodiments, reference is made to the accompanying drawings that form a part hereof. The accompanying drawings show, by way of illustration, specific embodiments in which the invention may be practiced. It is to be understood that other embodiments may be utilized, and structural or logical changes may be made without departing from the scope of the present invention. The following detailed description, therefore, is not to be taken in a limiting sense, and the scope of the invention is defined by the appended claims.

In one aspect, the present invention includes a multi-layer shielding article that is useful for shielding radio frequency identification devices by interfering with or cutting off the electrical or magnetic radio frequency detecting signal emitted from electromagnetic equipment, electronics equipment, receiving devices, or other external devices.

Figure 1:
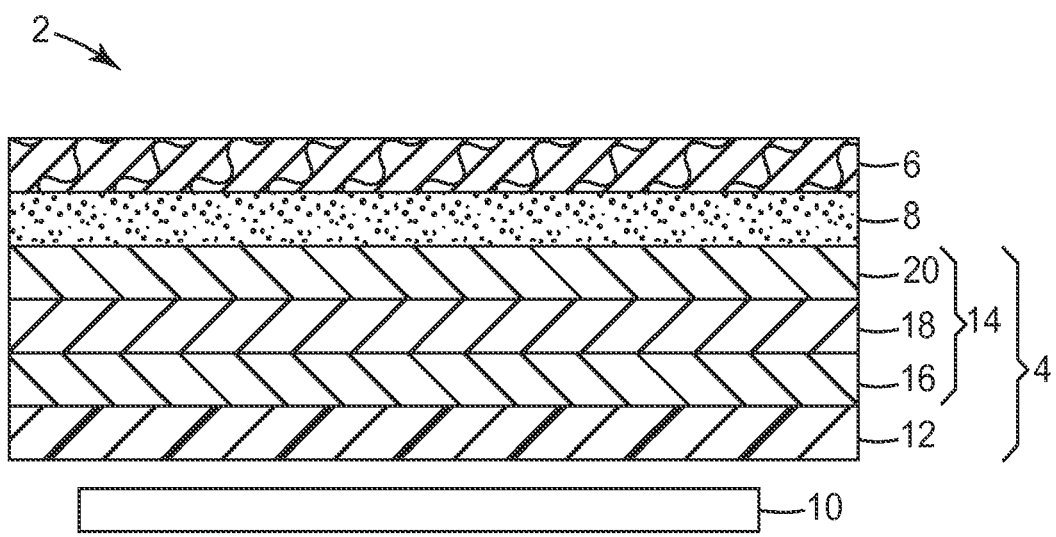
FIG. 1 is a schematic cross-sectional view of an exemplary embodiment of a shielding article and a radio frequency information component according to an aspect of the present invention.

FIG. 1 illustrates an exemplary embodiment of a shielding article according to an aspect of the present invention. Shielding article 2 includes a polymeric conductive layer 4, a protective layer 6, and an optional adhesive layer 8 positioned between polymeric conductive layer 4 and protective layer 6. Polymeric conductive layer 4 provides electromagnetic shielding characteristics so as to prevent receipt of data from a radio frequency information component 10 by an external device (not shown) when the polymeric conductive and protective layers are located between the external device on one side and the radio frequency information component on the other side. In the embodiment shown in FIG. 1, shielding article 2 is positioned relative to radio frequency information component 10 such that polymeric conductive layer 4 faces radio frequency information component 10. In other embodiments, shielding article 2 may be positioned relative to radio frequency information component 10 such that protective layer 6 faces radio frequency information component 10. In the embodiment shown in FIG. 1, polymeric conductive layer 4 includes a polymeric layer 12 and a conductive layer 14 disposed on polymeric layer 12. Conductive layer 14 may be formed by metalizing polymeric layer 12, such as, e.g., by chemical deposition (such as, e.g., electroplating), physical deposition (such as, e.g., sputtering), or any other suitable method. Alternatively, conductive layer 14 may be laminated onto polymeric layer 12. In place of or in addition to conductive layer 14, polymeric conductive layer 4 may include a polymeric layer 12 filled with conductive particles. Polymeric layer 12 may include any suitable polymeric material, including but not limited to polyester, polypropylene, polycarbonate, and polyethylene. In one embodiment, polymeric layer 12 has a thickness in the range of 0.02 mm to 0.08 mm. In the embodiment shown in FIG. 1, conductive layer 14 includes a layer of copper 18 between a first layer of nickel 16 (also referred to as "priming") and a second layer of nickel 20

(also referred to as "covercoat"). First nickel layer 16, copper layer 18, and second nickel layer 20 are deposited on the surface of polymeric layer 12 using any suitable method known in the art. Polymeric layer 12 provides sufficient flexibility for the final use of shielding article 2, while it also has sufficient rigidity for use in the metal deposition process. Nickel layers 16, 20 on either side of copper layer 18 provide better adhesion to polymeric layer 12 than copper alone and also serve as corrosion protection layers for copper layer 18. Copper layer 18 provides excellent electrical conductivity to allow the construction to act as a shielding article for radio frequency information component 10. In one embodiment, first nickel layer 16 has a thickness in the range of 100 to 400 Angstroms (10 to 40 nm), copper layer 18 has a thickness in the range of 1000 to 3000 Angstroms (100 to 300 nm), and second nickel layer 20 has a thickness in the range of 150 to 600 Angstroms (15 to 60 nm). In a preferred embodiment, first nickel layer 16 has a thickness in the range of 100 to 200 Angstroms (10 to 20 nm), copper layer 18 has a thickness in the range of 1600 to 1800 Angstroms (160 to 180 nm), and second nickel layer 20 has a thickness in the range of 200 to 400 Angstroms (20 to 40 nm). The preferred ranges of material thickness allow a desired balance of material flexibility and reliability, while providing adequate amounts of material for electrical conductivity and corrosion protection. Layers of nickel 16, 20 are defined herein as layers including at least one of nickel (Ni), nickel alloys, and austenitic nickel-based superalloys, such as, e.g., the austenitic nickel-based superalloy available under the trade designation INCONEL from Special Metals Corporation, New Hartford, N.Y., U.S.A. Layer of copper 18 is defined herein as a layer including at least one of copper (Cu) and copper alloys.

In one embodiment, protective layer 6 includes a polyester paper coated with an inorganic coating, such as, e.g., the polyester paper coated with an inorganic coating available under the trade designation TufQUIN from 3M Company, St. Paul, Minn., U.S.A. TufQUIN offers the high-temperature capabilities of inorganic materials combined with the high mechanical strength gained by the use of organic fiber. TufQUIN papers can be combined with polyester film to form a flexible laminate uniquely suited for high temperature electrical insulation applications. In another embodiment, protective layer 6 includes an aramid paper, such as, e.g., the aramid paper available under the trade designation NOMEX from E. I. du Pont de Nemours and Company, Wilmington, Del., U.S.A. Protective layer 6 is typically capable of offering chemical protection (such as, e.g., protection against corrosion) as well as physical protection (such as, e.g., protection against abrasion).

In one embodiment, adhesive layer 8 is used to bond protective layer 6 to polymeric conductive layer 4. Adhesive layer 8 may include a pressure sensitive adhesive (PSA), a heat activated adhesive (HAA), a hot melt adhesive, an acrylic adhesive, a nonconductive adhesive, a conductive adhesive, or any other suitable adhesive. Adhesive layer 8 may include a corrosion inhibitor. In one embodiment, adhesive layer 8 has a thickness in the range of 0.01 mm to 0.04 mm.

The shielding article described herein has numerous advantages for its intended use. Some of those advantages are described in greater detail below.

Abrasion Resistance and Shielding Effectiveness

Useful benefits of a shielding article according to an aspect of the present invention include its abrasion resistance and its shielding effectiveness, in particular the combination thereof.

Abrasion testing on shielding articles according to an aspect of the present invention and conventional shielding articles was conducted to determine the abrasion resistance of the shielding articles. The abrasion testing was conducted generally following the Standard Guide for Abrasion Resistance of Textile Fabrics (Rotary Platform, Double-Head Method) ASTM D 3884-01 (2007). Circular test samples of the shielding articles were prepared. Each test sample had a 4.1 inch (10.4 cm) diameter and a 6 mm diameter hole in the center of the test sample. The following test samples were prepared. Test samples 101 and 102 were samples of shielding article 2 including polymeric layer 12 comprising polyester and having a thickness of about 2.0 mil (0.05 mm), first nickel layer 16 having a thickness of about 150 Angstroms (15 nm), copper layer 18 having a thickness of about 1700 Angstroms (170 nm), second nickel layer 20 having a thickness of about 300 Angstroms (30 nm), adhesive layer 8 comprising a pressure sensitive adhesive (PSA) and having a thickness of about 0.025 mm, and protective layer 6 comprising TufQUIN 110 and having a thickness of about 3.0 mil (0.08 mm). Test samples 103 and 104 were samples of shielding article 2 including polymeric layer 12 comprising polyester and having a thickness of about 2.0 mil (0.05 mm), first nickel layer 16 having a thickness of about 150 Angstroms (15 nm), copper layer 18 having a thickness of about 1700 Angstroms (170 nm), second nickel layer 20 having a thickness of about 300 Angstroms (30 nm), adhesive layer 8 comprising a pressure sensitive adhesive (PSA) and having a thickness of about 0.025 mm, and protective layer 6 comprising NOMEX 410 and having a thickness of about 3.0 mil (0.08 mm). Comparative test samples C105 and C106 were samples of a conventional shielding article including an aluminum foil layer having a thickness of about 6 μm and a protective layer comprising TYVEK and having a thickness of about 508 μm. TYVEK is a brand of flashspun high-density polyethylene fibers, a synthetic material available from E. I. du Pont de Nemours and Company, Wilmington, Del., U.S.A. Comparative test samples C107 and C108 were samples of a conventional shielding article including a free floating aluminum foil having a thickness of about 23 μm enclosed by a heat sealed protective layer comprising vinyl and having a thickness of about 690 μm. A Taber abraser machine, available from Taber Industries of North Tonawanda, N.Y., U.S.A., was used to abrade the test samples in the following manner. The test samples were placed on the abraser holding apparatus with the protective layer of the shielding article facing up. A CS-10 abrasion wheel, available from Taber Industries of North Tonawanda, N.Y., U.S.A., was installed on the abraser machine and a test load of 500 g applied to the wheel. For samples 101, 103, C105 and C107, 500 cycles were performed at a speed of 60 cycles per minute (cpm) with the abraser machine. For samples 102, 104, C106 and C108, 2,000 cycles were performed at a speed of 60 cycles per minute (cpm) with the abraser machine. After the abraser machine had stopped, the test samples were visually inspected for signs of degradation. The results of the abrasion testing described above are shown in Table 1.

TABLE 1

| Sample Description | No. of Cycles | Result |
| --- | --- | --- |
| Sample 101 | 500 | No wear |
| Sample 103 | 500 | No wear |
| Sample C105 | 500 | Significant wear |
| Sample C107 | 500 | No wear |
| Sample 102 | 2,000 | Slight wear |
| Sample 104 | 2,000 | No wear |
| Sample C106 | 2,000 | Abraded through |
| Sample C108 | 2,000 | No wear |

Abrasion testing on protective layers of shielding articles according to an aspect of the present invention and protective layers of conventional shielding articles was conducted to determine the effect on abrasion resistance due to water penetration. The abrasion testing was conducted generally following the Standard Guide for Abrasion Resistance of Textile Fabrics (Rotary Platform, Double-Head Method) ASTM D 3884-01 (2007). Circular test samples of the protective layers were prepared. Each test sample had a 4.1 inch (10.4 cm) diameter and a 6 mm diameter hole in the center of the test sample. The following test samples were prepared. Test samples 201, 202 and 203 were samples of protective layer 6 of shielding article 2, protective layer 6 comprising TufQUIN 110 and having a thickness of about 3.0 mil (0.08 mm). Comparative test samples C204, C205 and C206 were samples of a protective layer of a conventional shielding article, the protective layer comprising TYVEK 1025D and having a thickness of about 5.0 mil (0.13 mm). Samples 201 and C204 were soaked in water for 5 minutes, samples 202 and C205 were soaked in water for 24 hours, and samples 203 and C206 were soaked in water for 48 hours. A Taber abraser machine was used to abrade the test samples in the following manner. The test samples were placed on the abraser holding apparatus. A CS-10 abrasion wheel was installed on the abraser machine and a test load of 500 g applied to the wheel. 500 cycles were performed at a speed of 60 cycles per minute (cpm) with the abraser machine. After the abraser machine had stopped, the test samples were visually inspected for signs of degradation. The results of the abrasion testing described above are shown in Table 2.

TABLE 2

| Sample Description | Water Soak Time | Result |
|---|---|---|
| Sample 201 | 5 minutes | No wear |
| Sample C204 | 5 minutes | Significant wear |
| Sample 202 | 24 hours | Slight wear |
| Sample C205 | 24 hours | Abraded through |
| Sample 203 | 48 hours | Slight wear |
| Sample C206 | 48 hours | Abraded through |

As can be seen from the abrasion test results shown in Table 1 and Table 2, the protective layer of a shielding article according to an aspect of the present invention provides protection to the polymeric conductive layer of the shielding article to prevent the polymeric conductive layer from being abraded.

Shielding effectiveness measurements on shielding articles according to an aspect of the present invention and conventional shielding articles were conducted to determine the shielding performance of the shielding articles. The shielding effectiveness measurements were conducted generally following the Standard Test Method for Measuring the Electromagnetic Shielding Effectiveness of Planar Materials ASTM D 4935-99. The following test samples were prepared. Test sample 301 was a sample of shielding article 2 including polymeric layer 12 comprising polyester and having a thickness of about 2.0 mil (0.05 mm), first nickel layer 16 having a thickness of about 150 Angstroms (15 nm), copper layer 18 having a thickness of about 1700 Angstroms (170 nm), second nickel layer 20 having a thickness of about 300 Angstroms (30 nm), adhesive layer 8 comprising a pressure sensitive adhesive (PSA) and having a thickness of about 0.025 mm, and protective layer 6 comprising TufQUIN 110 and having a thickness of about 3.0 mil (0.08 mm). Test sample 302 was a sample of shielding article 2 including polymeric layer 12 comprising polyester and having a thickness of about 2.0 mil (0.05 mm), first nickel layer 16 having a thickness of about 150 Angstroms (15 nm), copper layer 18 having a thickness of about 1700 Angstroms (170 mm), second nickel layer 20 having a thickness of about 300 Angstroms (30 nm), adhesive layer 8 comprising a pressure sensitive adhesive (PSA) and having a thickness of about 0.025 mm, and protective layer 6 comprising NOMEX 410 and having a thickness of about 3.0 mil (0.08 mm). Comparative test sample C303 was a sample of a conventional shielding article including an aluminum foil layer having a thickness of about 6 μm and a protective layer comprising TYVEK and having a thickness of about 508 μm. Comparative test sample C304 was a sample of a conventional shielding article including a free floating aluminum foil having a thickness of about 23 μm enclosed by a heat sealed protective layer comprising vinyl and having a thickness of about 690 μm. Comparative test sample C305 was a sample of a conventional shielding article including an aluminum layer having a thickness of about 6.4 μm sandwiched by a protective layer comprising paper and having a thickness of about 544 μm. The results of the shielding effectiveness measurements described above are shown in FIG. 2.

Figure 2:
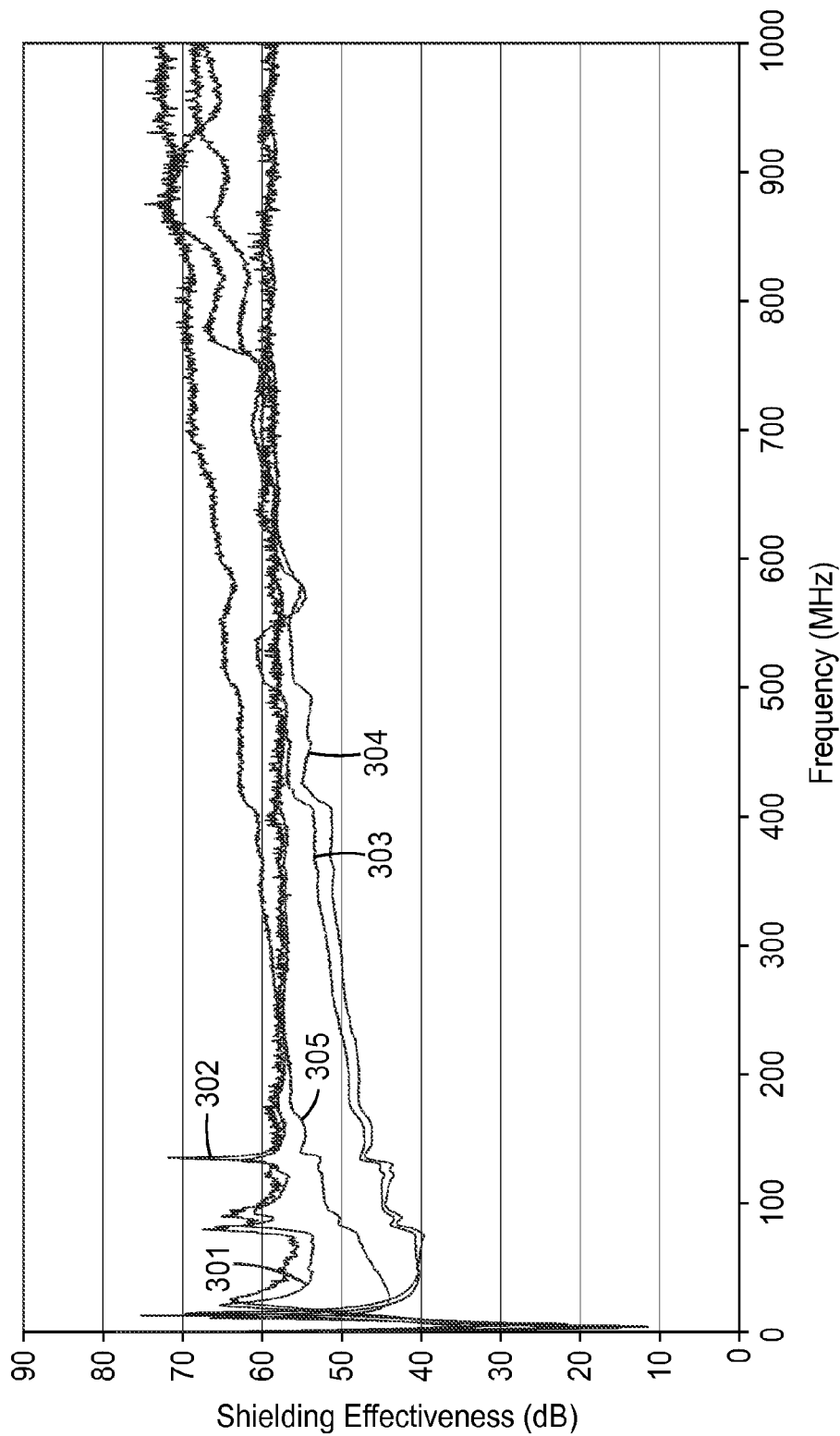
FIG. 2 is a graph illustrating the improved shielding effectiveness achieved by a shielding article according to an aspect of the present invention.

As can be seen from the shielding effectiveness measurements shown in FIG. 2, a shielding article according to an aspect of the present invention provides consistent shielding effectiveness across a frequency range of about 300 kHz to about 1 GHz, while the shielding effectiveness of a conventional shielding article is lower at the low end of the measured frequency range and higher at the high end of the measured frequency range.

Abrasion testing on shielding articles according to an aspect of the present invention and conventional shielding articles was conducted in combination with mass, thickness, and shielding effectiveness measurements on the shielding articles to determine the mass change and thickness change of the shielding articles as a result of abrasion testing, and the impact of abrasion testing on the shielding performance of the shielding articles. The abrasion testing was conducted generally following the Standard Guide for Abrasion Resistance of Textile Fabrics (Rotary Platform, Double-Head Method) ASTM D 3884-01 (2007). The shielding effectiveness measurements were conducted generally following the Standard Test Method for Measuring the Electromagnetic Shielding Effectiveness of Planar Materials ASTM D 4935-99. To conduct the abrasion testing, a hole in the center of the test sample is required for placement on the abraser holding apparatus. However, to adequately measure the shielding effectiveness, a test sample without any holes, punctures, slits, or the like is required. In part to overcome this challenge, the testing was conducted as follows. Circular test samples of the shielding articles were prepared. Each test sample had a 4.1 inch (10.4 cm) diameter. The following test samples were prepared. Test samples 401 and 402 were samples of shielding article 2 including polymeric layer 12 comprising polyester and having a thickness of about 2.0 mil (0.05 mm), first nickel layer 16 having a thickness of about 150 Angstroms (15 nm), copper layer 18 having a thickness of about 1700 Angstroms (170 nm), second nickel layer 20 having a thickness of about 300 Angstroms (30 nm), adhesive layer 8 comprising a pressure sensitive adhesive (PSA) and having a thickness of about 0.025 mm, and protective layer 6 comprising TufQUIN 110 and having a thickness of about 3.0 mil (0.08 mm). Test samples 403 and 404 were samples of shielding article 2 including polymeric layer 12 comprising polyester and having a thickness of about 2.0 mil (0.05 mm), first nickel layer 16 having a thickness of about 150 Angstroms (15 nm), copper layer 18 having a thickness of about 1700 Angstroms (170 nm), second nickel layer 20 having a thickness of about 300 Angstroms (30 nm), adhesive layer 8 comprising a pressure sensitive adhesive (PSA) and having a thickness of about 0.025 mm, and protective layer 6 comprising NOMEX 410 and having a thickness of about 3.0 mil (0.08 mm). Test samples 405 and 406 were samples of shielding article 2 including polymeric layer 12 comprising polyester and having a thickness of about 2.0 mil (0.05 mm), first nickel layer 16 having a thickness of about 150 Angstroms (15 nm), copper layer 18 having a thickness of about 1700 Angstroms (170 nm), second nickel layer 20 having a thickness of about 300 Angstroms (30 nm), adhesive layer 8 comprising a pressure sensitive adhesive (PSA) and having a thickness of about 0.025 mm, and protective layer 6 comprising TYVEK 1025D and having a thickness of about 5.0 mil (0.13 mm). Comparative test sample C407 was a sample of a conventional shielding article including an aluminum foil layer having a thickness of about 6 µm and a protective layer comprising TYVEK and having a thickness of about 508 µm. The initial thickness (T1) of the test samples was measured. A Mitutoyo linear gage, available from Mitutoyo Corporation, Kawasaki, Japan, was used to measure the test sample thickness. The shielding effectiveness (SE1) of the test samples was measured. A 6 mm diameter hole was cut in the center of the test samples to prepare the test samples for abrasion testing. The initial mass (M1) of the test samples was measured. A Mettler PM100 precision scale, available from Mettler-Toledo Inc., Columbus, Ohio, U.S.A., was used to measure the test sample mass. The shielding effectiveness (SE2) of the punctured test samples was measured. A patch of test Sample material was temporarily placed over the hole in the test samples to prepare the test samples for shielding effectiveness measurement. The shielding effectiveness (SE3) of the patched test samples was measured. Shielding effectiveness measurements SE1, SE2 and SE3 were compared to determine the impact of the hole in the test samples and the patch of test sample material on the shielding effectiveness of the test samples. Findings comparing the shielding effectiveness showed insignificant differences between samples measured with a hole versus samples measured with the patch. A Taber abraser machine was used to abrade the test samples in the following manner. The test samples were placed on the abraser holding apparatus. A CS-10 abrasion wheel was installed on the abraser machine and a test load of 500 g applied to the wheel. 7,000 cycles were performed at a speed of 60 cycles per minute (cpm) with the abraser machine. The abraser machine was stopped at every 500 cycles at which points the test samples were temporarily removed from the abraser machine for mass (M2), thickness (T2), and shielding effectiveness measurements. The mass change of each of the samples as a result of abrasion testing was calculated using the formula $((M2-M1)/M1) \times 100\%$. The thickness change of each of the samples as a result of abrasion testing was calculated using the formula $((T2-T1)/T1) \times 100\%$. For the shielding effectiveness measurements, the patch of test sample material was temporarily placed over the 6 mm diameter hole of the test samples. The results of the abrasion testing described above are shown in FIG. 3A with respect to mass change, FIG. 3B with respect to thickness change, and FIGS. 4A-4D with respect to shielding effectiveness.

Figure 3A:
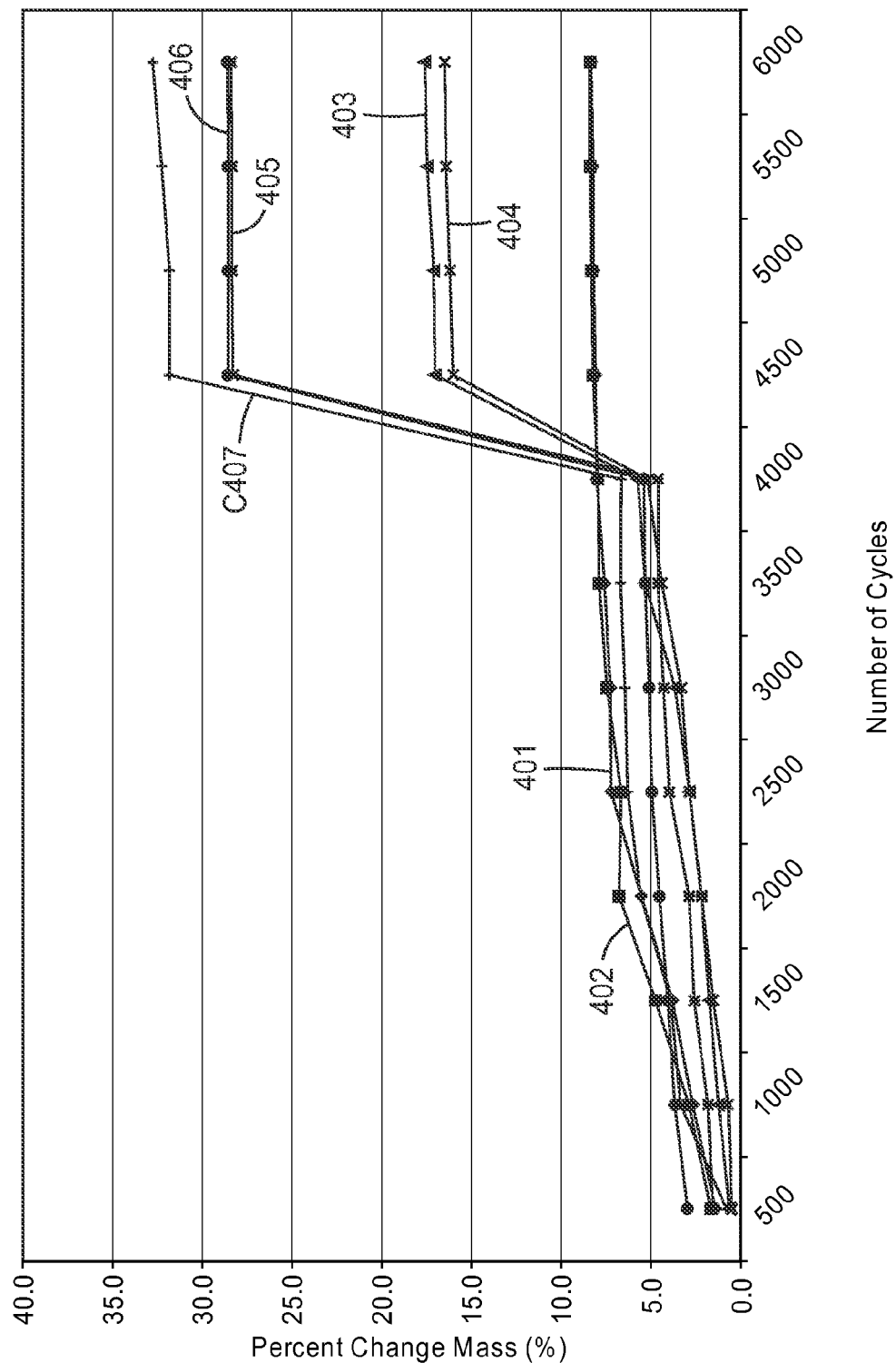
FIG. 3A-3B are graphs illustrating the improved abrasion resistance achieved by a shielding article according to an aspect of the present invention.

As can be seen from the mass change measurements shown in FIG. 3A, the impact of abrasion testing on the mass change of a shielding article according to an aspect of the present invention as well as a conventional shielding article is minimal up to about 4,000 cycles. Beyond 4,000 cycles, a shielding article according to an aspect of the present invention including a protective layer comprising TufQUIN or NOMEX provides an improved performance with regards to abrasion resistance over conventional shielding articles and a shielding article according to an aspect of the present invention including a protective layer comprising TYVEK. This is an unexpected and previously unknown useful advantage of TufQUIN and NOMEX.

Figure 3B:
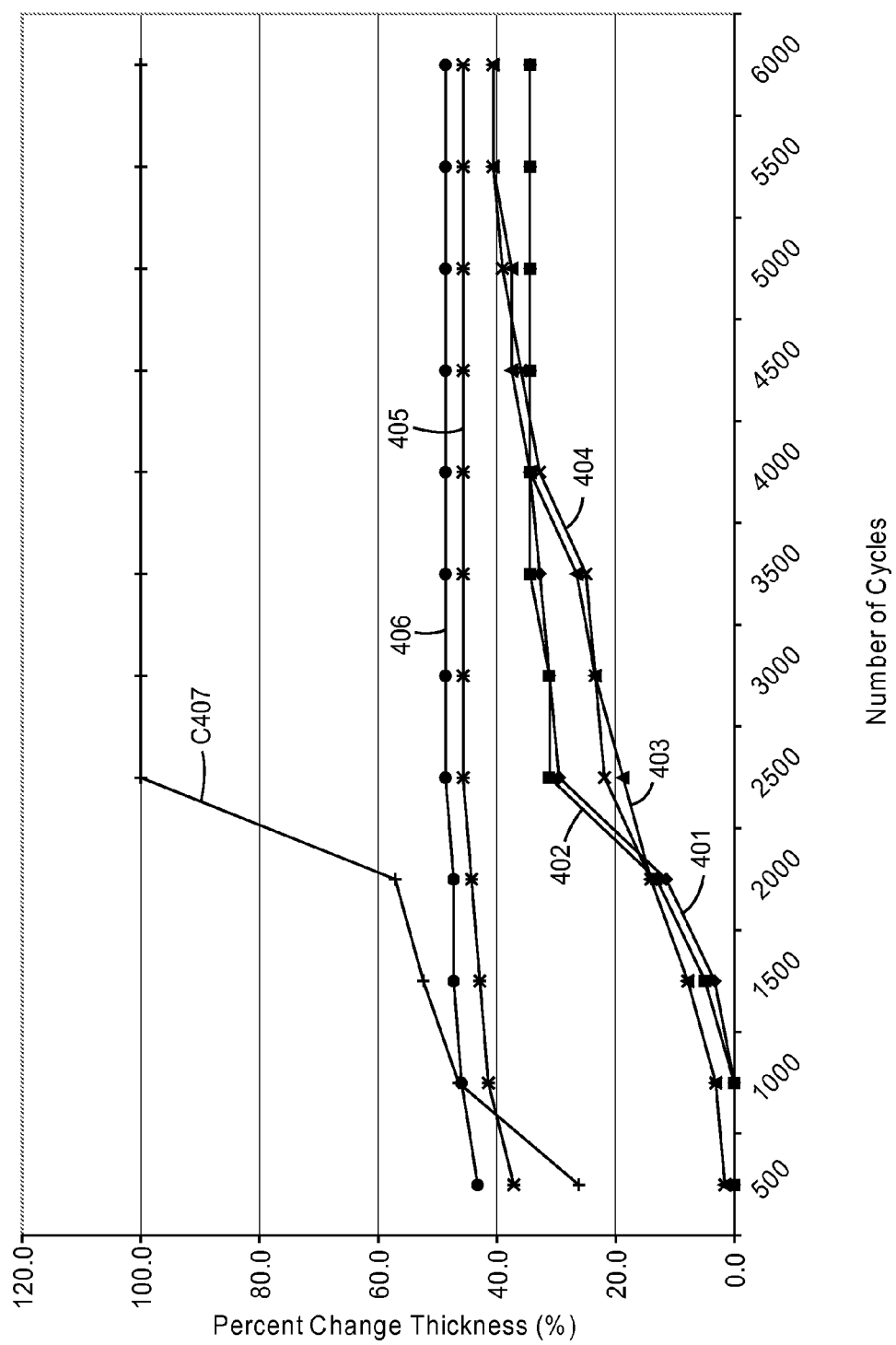

As can be seen from the thickness change measurements shown in FIG. 3B, a shielding article according to an aspect of the present invention including a protective layer comprising TufQUIN or NOMEX provides an improved performance with regards to abrasion resistance over conventional shielding articles and a shielding article according to an aspect of the present invention including a protective layer comprising TYVEK. This is an unexpected and previously unknown useful advantage of TufQUIN and NOMEX.

As can be seen from the shielding effectiveness measurements shown in FIG. 4A-4D, the impact of abrasion testing on the shielding effectiveness of a shielding article according to an aspect of the present invention is minimal. For example, referring to FIGS. 4A and 4C, after 6,000 cycles of abrasion testing, a change of generally less than 5 dB in shielding effectiveness across a frequency range of 0 to 1,000 MHz was measured. In contrast, the impact of abrasion testing on the shielding effectiveness of a conventional shielding article is significant. For example, referring to FIGS. 4B and 4D, after 6,000 cycles of abrasion testing, a significant reduction in shielding effectiveness across a frequency range of 0 to 1,000 MHz was measured.

Figure 4A:
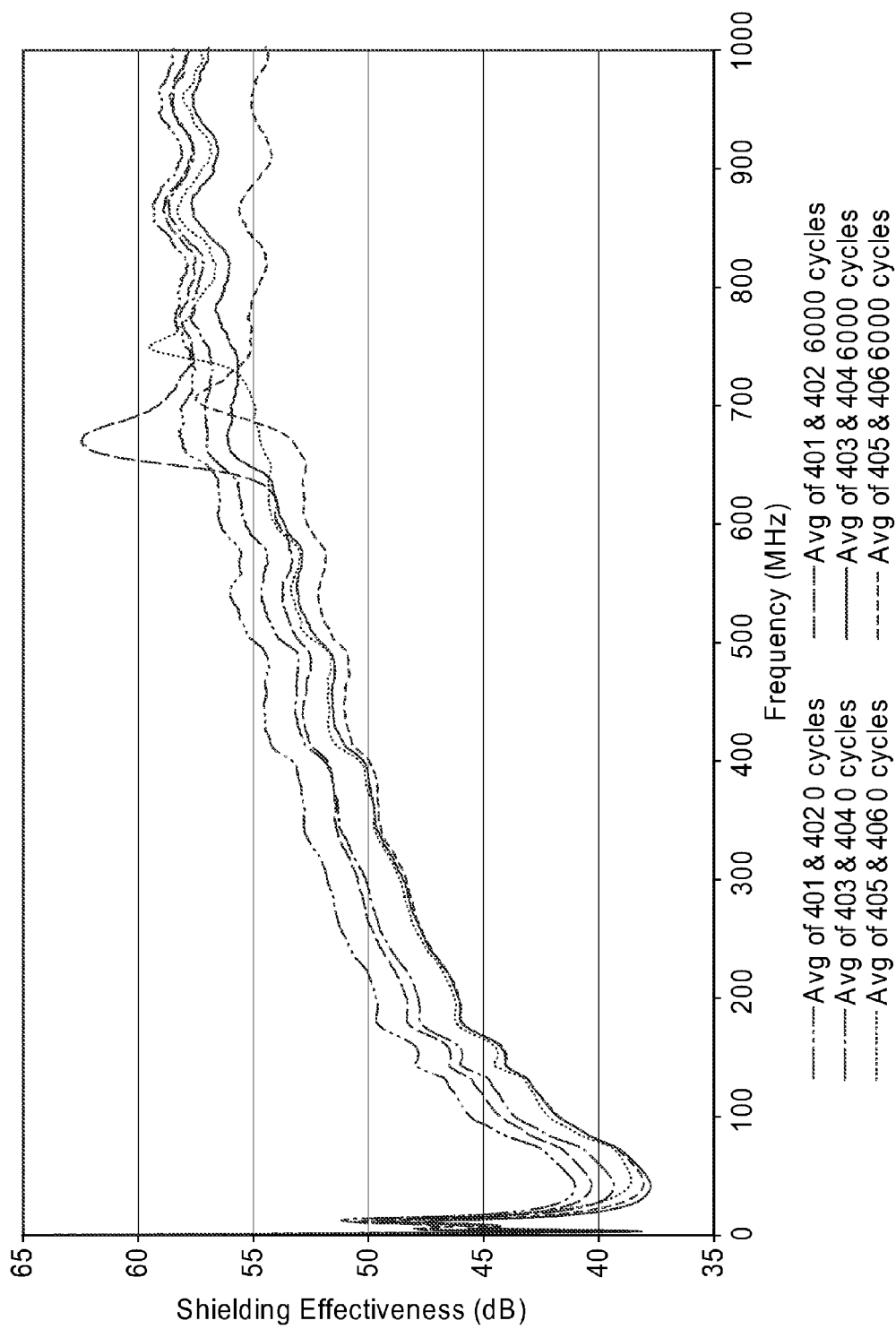
FIG. 4A-4D are graphs illustrating the improved shielding effectiveness in combination with abrasion resistance achieved by a shielding article according to an aspect of the present invention.
Figure 4B:
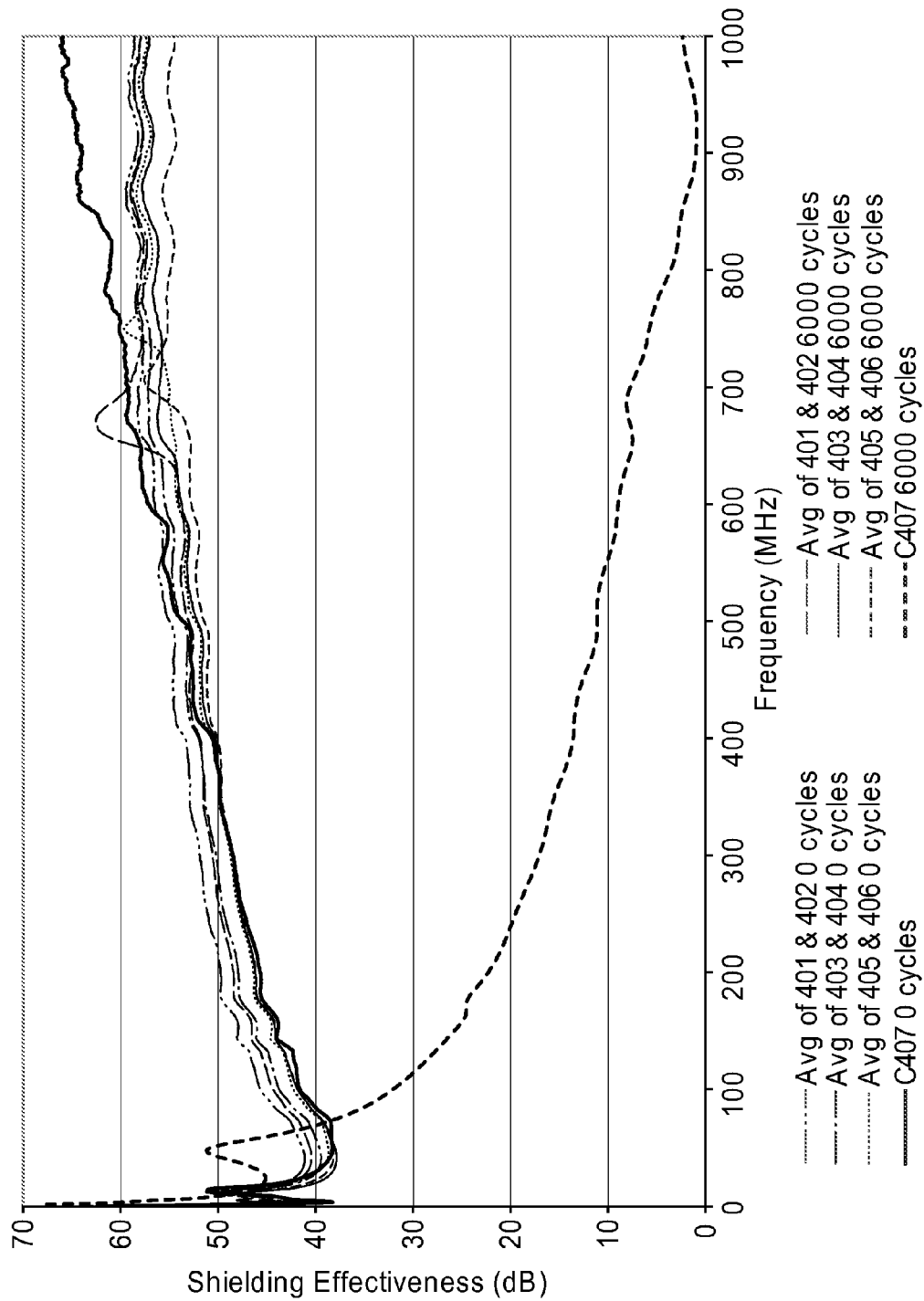
Figure 4C:
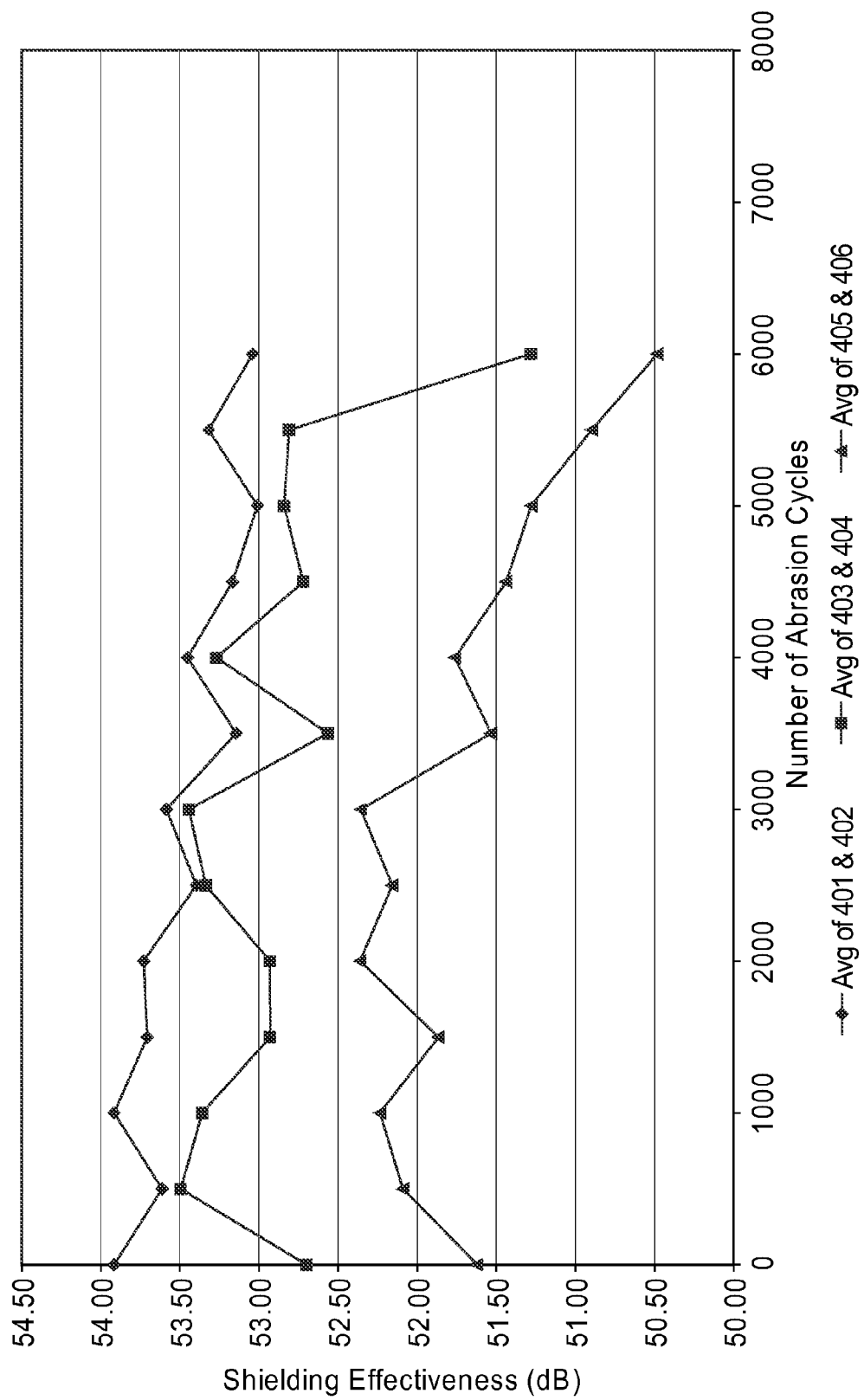
Figure 4D:
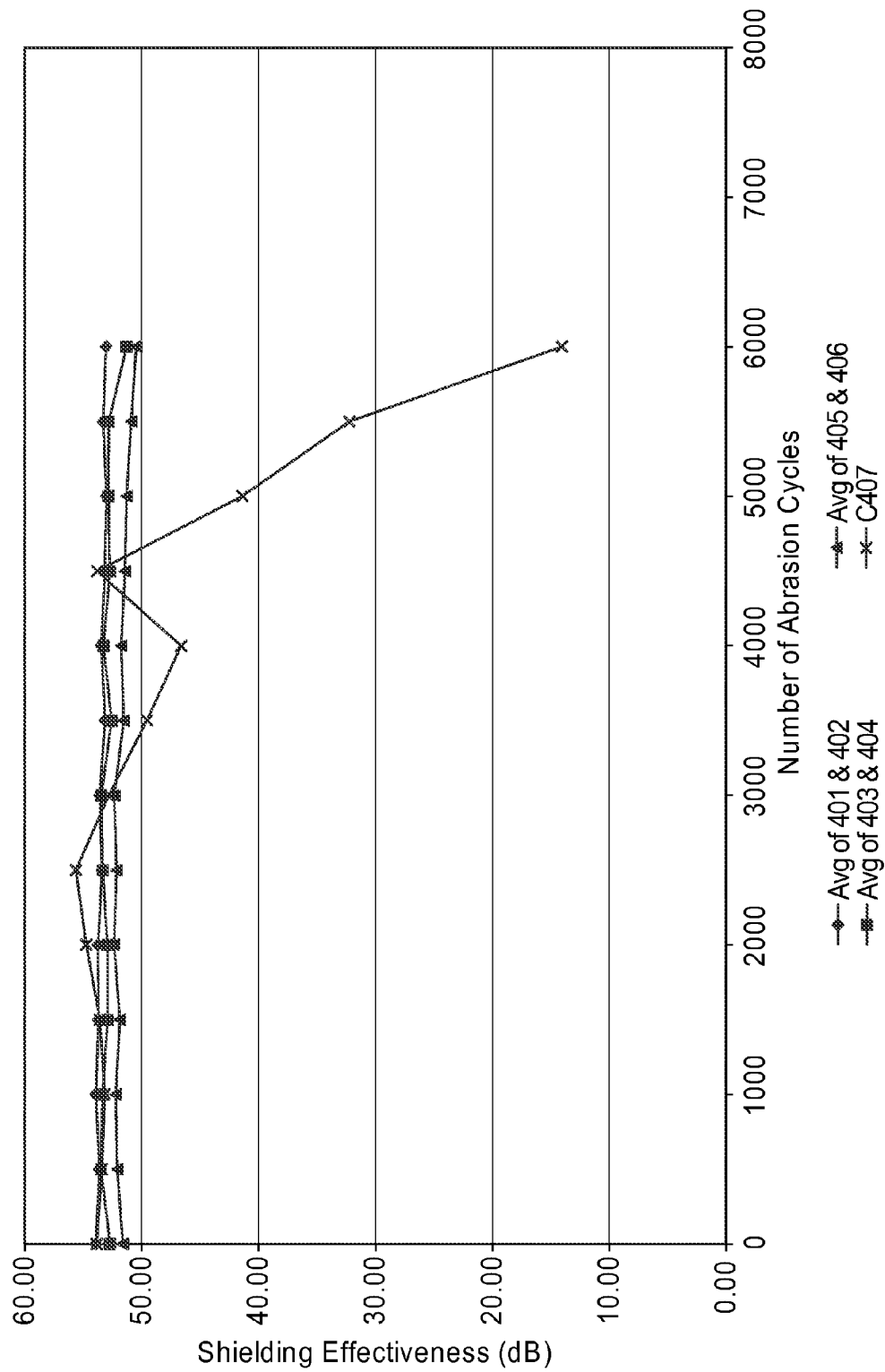

In addition, referring to FIG. 4C, a shielding article according to an aspect of the present invention including a protective layer comprising TufQUIN or NOMEX provides an improved performance with regards to abrasion resistance in combination with shielding effectiveness over a shielding article according to an aspect of the present invention including a protective layer comprising TYVEK. This is an unexpected and previously unknown useful advantage of TufQUIN and NOMEX.

Thinness

Another useful benefit of a shielding article according to an aspect of the present invention is its thinness, in particular in applications where the shielding article is shaped to substantially surround a radio frequency information component, such as, e.g., an identification card, an insurance card, a timecard, a smartcard, a payment card, an entry card, a passport, or the like. For example, if the radio frequency information component is an identification card shaped to fit a wallet or billfold pocket and the shielding article is shaped to substantially surround the identification card, it would be beneficial to size the shielding article such that, on the one hand, the identification card can be easily inserted in and removed from the shielding article, and, on the other hand, the shielding article can be easily inserted in and removed from a wallet or billfold pocket and does not add significantly to the bulk of the wallet or billfold. Thinness of the shielding article enables these desirable features.

Thickness measurements on shielding articles according to an aspect of the present invention and conventional shielding articles were conducted. The following test samples were prepared. Test sample 501 was a sample of shielding article 2 including polymeric layer 12 comprising polyester and having a thickness of about 2.0 mil (0.05 mm), first nickel layer 16 having a thickness of about 150 Angstroms (15 nm), copper layer 18 having a thickness of about 1700 Angstroms (170 nm), second nickel layer 20 having a thickness of about 300 Angstroms (30 nm), adhesive layer 8 comprising a pressure sensitive adhesive (PSA) and having a thickness of about 0.025 mm, and protective layer 6 comprising TufQUIN 110 and having a thickness of about 3.0 mil (0.08 mm). Test sample 502 was a sample of shielding article 2 including polymeric layer 12 comprising polyester and having a thickness of about 2.0 mil (0.05 mm), first nickel layer 16 having a thickness of about 150 Angstroms (15 nm), copper layer 18 having a thickness of about 1700 Angstroms (170 nm), second nickel layer 20 having a thickness of about 300 Angstroms (30 nm), adhesive layer 8 comprising a pressure sensitive adhesive (PSA) and having a thickness of about 0.025 mm, and protective layer 6 comprising NOMEX 410 and having a thickness of about 3.0 mil (0.08 mm). Comparative test sample C503 was a sample of a conventional shielding article including an aluminum layer having a thickness of about 6.4 µm sandwiched by a protective layer comprising paper and having a thickness of about 542.4 µm. Comparative test sample C504 was a sample of a conventional shielding article including an aluminum foil layer having a thickness of about 6 µm and a protective layer comprising TYVEK and having a thickness of about 508 µm. Comparative test sample C505 was a sample of a conventional shielding article including a free floating aluminum foil having a thickness of about 23 µm enclosed by a heat sealed protective layer comprising vinyl and having a thickness of about 690 µm. Comparative test sample C506 was a sample of a conventional shielding article including an aluminum insert having a thickness of about 513.08 µm positioned in a vinyl sleeve having a thickness of about 366.4 µm. A Mitutoyo linear gage, available from Mitutoyo Corporation, Kawasaki, Japan, was used to measure the overall thickness of the test samples and the metal thickness of test samples C505 and C506. A Hitachi S-4700 Field Emission Scanning Electron Microscope (FESEM), available from Hitachi High Technologies America Inc., Pleasanton, Calif., U.S.A., was used to measure the metal thickness of test samples 501, 502, C503 and C504 as follows. Each test sample was attached to a FESEM stub with carbon conductive tape. The imaging conditions were 0.8 KV, 5.0 KV, 12 mm WD, UHR-A, tilt: 0. The magnifications were 600× and 10,000×. The samples were imaged using ExB low voltage compositional imaging. The samples were analyzed using Energy Dispersive X-Ray (EDX) analysis point and shoot mode. The results of the thickness measurements described above are shown in Table 3.

TABLE 3

| Sample Description | Thickness (µm) | |
|---|---|---|
| | Overall | Metal |
| Sample 501 | 447.00 | 0.18 |
| Sample 502 | 447.00 | 0.18 |
| Sample C503 | 550.00 | 6.40 |
| Sample C504 | 513.72 | 5.60 |
| Sample C505 | 713.10 | 22.86 |
| Sample C506 | 879.48 | 513.08 |

As can be seen from the thickness measurements shown in Table 3, the thickness of a shielding article according to an aspect of the present invention is significantly smaller than the thickness of the conventional shielding articles.

Printability

Another useful benefit of a shielding article according to an aspect of the present invention is its printability. The shielding article is easily printable using offset printing, screen printing, laser printing, inkjet printing, or other suitable printing methods. For example, in the embodiment shown in FIG. 1, protective layer 6 including a polyester paper coated with an inorganic coating, such as, e.g., TufQUIN, or including an aramid paper, such as, e.g., NOMEX, enables printability of shielding article 2.

Low Friction Surface

Another useful benefit of a shielding article according to an aspect of the present invention is its low friction surface, in particular in applications where the shielding article is shaped to substantially surround a radio frequency information component, such as, e.g., an identification card, an insurance card, a timecard, a smartcard, a payment card, an entry card, a passport, or the like. For example, if the radio frequency information component is an identification card and the shielding article is shaped to substantially surround the identification card, it would be beneficial for the shielding article to have a low friction surface such that the identification card can be easily inserted in and removed from the shielding article. For example, in the embodiment shown in FIG. 1, polymeric layer 12 comprising polyester enables low friction insertion and removal of the identification card in/from shielding article 2 shaped to substantially surround the identification card.

Corrosion Resistance

Another useful benefit of a shielding article according to an aspect of the present invention is its corrosion resistance, in particular in applications where the shielding article is exposed to moisture and/or heat. In the exemplary embodiment shown in FIG. 1, conductive layer 12 of shielding article includes a layer of copper 18. Copper layer 18 includes at least one of copper (Cu) and copper alloys which are generally prone to corrosion. It is important to protect copper layer 18 against corrosion, because corrosion of copper layer 18 may reduce the shielding effectiveness of shielding article 2. The construction of shielding article 2 shown in FIG. 1 has a number of elements that assist in protecting copper layer 18 from corrosion. For example, Nickel layers 16, 20 on either side of copper layer 18 serve as corrosion protection layers for copper layer 18. In addition, polymeric layer 12 provides protection against corrosion on one side of copper layer 18, while protective layer 6 and optional adhesive layer 8 provide protection against corrosion on the other side of copper layer 18. Adhesive layer 8 may include a corrosion inhibitor to further protect copper layer 18 against corrosion.

Figure 5:
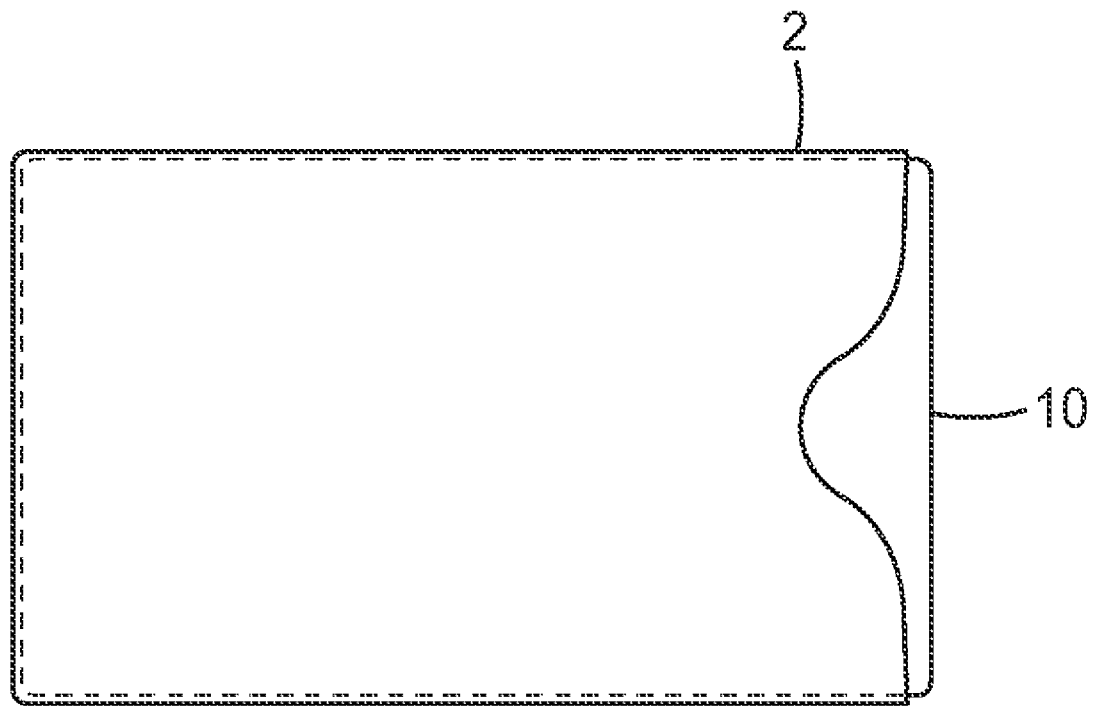
FIG. 5 is a front view of another exemplary embodiment of a shielding article and a radio frequency information component according to an aspect of the present invention.

FIG. 5 illustrates another exemplary embodiment of a shielding article according to an aspect of the present invention. Shielding article 2 includes a polymeric conductive layer 4 and a protective layer 6 disposed adjacent the polymeric conductive layer as shown in FIG. 1. In the exemplary embodiment of FIG. 5, shielding article 2 is shaped to substantially surround a radio frequency information component 10. In this configuration, shielding article 2 can also be referred to as secure sleeve or protective sleeve. Shaping shielding article 2 may be done using any suitable method or process known in the art. In one aspect, shaping may include cutting, folding, and adhering or otherwise connecting a substantially flat laminate. In another aspect, shaping may include flattening out and cutting a substantially tubular laminate.

When radio frequency information component 10 and shielding article 2 are in an assembled configuration, polymeric conductive layer 4 provides electromagnetic shielding characteristics so as to prevent receipt of data from radio frequency information component 10 by an external device (not shown). Radio frequency information component 10 may include an identification card, an insurance card, a timecard, a smartcard, a payment card, an entry card, a passport, or the like. In one aspect, shielding article 2 may be shaped and sized corresponding with the size of radio frequency information component 10 and such that radio frequency information component 10 can be easily inserted in and removed from shielding article 2. For example, shielding article 2 may be shaped and sized to receive a credit card. In this regard, shielding article 2 may measure approximately 85.6 mm×53.98 mm×0.76 mm. In another example, shielding article 2 may be shaped and sized to receive a passport or visa. In this regard, shielding article 2 may measure approximately 125 mm×88 mm×3 mm. Those skilled in the art will appreciate that shielding articles having other shapes, sizes, and configurations are intended to be encompassed by the invention.

One particularly useful advantage of shielding article 2 is its ability to prevent theft of otherwise unauthorized acquisition of data or information. Shielding article 2 can advantageously prevent data or information from being stolen or otherwise detected by unauthorized users. For example, when an unauthorized user utilizes external electromagnetic or electronics equipment to acquire data or information from radio frequency identification component 10, shielding article 2 can frustrate, impede, and obstruct an attempt to acquire or capture such data or information from the radio frequency identification component 10 by substantially cutting off any magnetic and/or electromagnetic detecting signal emitted from the equipment, and/or by reflecting back the detecting signals emitted from the equipment.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A shielding article comprising:
   a polymeric conductive layer comprising a polymeric layer and a conductive layer disposed on the polymeric layer, the conductive layer comprising a layer of copper between a first layer of nickel and a second layer of nickel;
   a protective layer disposed adjacent the polymeric conductive layer; and
   an adhesive layer between the conductive layer and the protective layer,
   wherein the polymeric conductive layer provides electromagnetic shielding characteristics so as to prevent receipt of data from a radio frequency information component by an external device when the component is located between the external device on one side and the polymeric conductive and protective layers on the other side.

2. The shielding article of claim 1, wherein the polymeric layer comprises one of polyester, polypropylene, polycarbonate, and polyethylene.

3. The shielding article of claim 1, wherein the layer of copper has a thickness in the range of 1000 to 3000 Angstroms.

4. The shielding article of claim 3, wherein the layer of copper has a thickness in the range of 1600 to 1800 Angstroms.

5. The shielding article of claim 1, wherein the first layer of nickel has a thickness in the range of 100 to 400 Angstroms.

6. The shielding article of claim 1, wherein the second layer of nickel has a thickness in the range of 150 to 600 Angstroms.

7. The shielding article of claim 1, wherein the adhesive layer comprises a pressure sensitive adhesive.

8. The shielding article of claim 1, wherein the adhesive layer comprises a hot melt adhesive.

9. The shielding article of claim 1, wherein the adhesive layer comprises an acrylic adhesive.

10. The shielding article of claim 1, wherein the adhesive layer comprises a corrosion inhibitor.

11. The shielding article of claim 1, wherein the adhesive layer comprises a conductive adhesive.

12. The shielding article of claim 1, wherein the protective layer comprises a polyester paper coated with an inorganic coating.

13. The shielding article of claim 1, wherein the protective layer comprises an aramid paper.

14. The shielding article of claim 1, wherein the shielding article has a reduction in shielding effectiveness of less than about 5 dB after 6,000 cycles of abrasion resistance testing.

15. The shielding article of claim 1, wherein the protective layer facilitates a reduction in shielding effectiveness of the shielding article of less than about 5 dB after 6,000 cycles of abrasion resistance testing.

16. A shielding article comprising:
    a polymeric conductive layer comprising a polymeric layer and a conductive layer disposed on the polymeric layer, the conductive layer comprising a layer of copper between a first layer of nickel and a second layer of nickel;
    a protective layer disposed adjacent the polymeric conductive layer; and
    an adhesive layer between the conductive layer and the protective layer,
    wherein the shielding article is shaped to substantially surround a radio frequency information component, and wherein the polymeric conductive layer provides electromagnetic shielding characteristics so as to prevent receipt of data from the radio frequency information component by an external device when the radio frequency information component and the shielding article are in an assembled configuration.

17. The shielding article of claim 16, wherein the radio frequency information component comprises one of an identification card, an insurance card, a timecard, a smartcard, a payment card, an entry card, and a passport.

18. A method comprising:
    providing a shielding article comprising:
      a polymeric conductive layer comprising a polymeric layer and a conductive layer disposed on the polymeric layer, the conductive layer comprising a layer of copper between a first layer of nickel and a second layer of nickel;
      a protective layer disposed adjacent the polymeric conductive layer; and
      an adhesive layer between the conductive layer and the protective layer;
    disposing a radio frequency information component adjacent the polymeric conductive layer of the shielding article;
    shielding electromagnetic communication between the radio frequency information component and an external device; and
    preventing unauthorized release of information from the radio frequency information component.

* * * * *

UNITED STATES PATENT AND TRADEMARK OFFICE
CERTIFICATE OF CORRECTION

| | | |
|---|---|---|
| PATENT NO. | : 8,138,429 B2 | Page 1 of 1 |
| APPLICATION NO. | : 12/337299 | |
| DATED | : March 20, 2012 | |
| INVENTOR(S) | : Jeffrey Allen Lim | |

It is certified that error appears in the above-identified patent and that said Letters Patent is hereby corrected as shown below:

In the Specifications:

<u>Column 6</u>
Line 3, delete "(170 mm)," and insert -- (170 nm), --, therefor.

<u>Column 7</u>
Line 30, delete "Sample" and insert -- sample --, therefor.

Signed and Sealed this
Tenth Day of July, 2012

David J. Kappos
*Director of the United States Patent and Trademark Office*